United States Patent
Hollis

(10) Patent No.: US 10,229,890 B1
(45) Date of Patent: Mar. 12, 2019

(54) COMPENSATING FOR MEMORY INPUT CAPACITANCE

(71) Applicant: Micron Technology, Inc., Boise, ID (US)

(72) Inventor: Timothy M. Hollis, Meridian, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/872,456

(22) Filed: Jan. 16, 2018

(51) Int. Cl.
| | | |
|---|---|---|
| *H01L 23/64* | (2006.01) | |
| *H04L 27/04* | (2006.01) | |
| *H04B 5/00* | (2006.01) | |
| *H01L 23/00* | (2006.01) | |
| *H01L 25/065* | (2006.01) | |
| *G11C 11/16* | (2006.01) | |
| *G11C 11/401* | (2006.01) | |
| *G11C 11/22* | (2006.01) | |
| *G11C 13/00* | (2006.01) | |

(52) U.S. Cl.
CPC ............ *H01L 23/645* (2013.01); *H01L 24/02* (2013.01); *H01L 24/48* (2013.01); *H01L 25/0657* (2013.01); *H04B 5/0081* (2013.01); *H04L 27/04* (2013.01); *G11C 11/161* (2013.01); *G11C 11/221* (2013.01); *G11C 11/401* (2013.01); *G11C 13/0004* (2013.01); *H01L 2224/023* (2013.01); *H01L 2224/48105* (2013.01); *H01L 2924/15311* (2013.01)

(58) Field of Classification Search
CPC ....... H01L 23/645; H01L 24/48; H01L 24/02; H01L 25/0657; H01L 2924/15311; H01L 2224/48105; H01L 2224/023; H04L 27/04; H04B 5/0081; G11C 11/221; G11C 13/0004; G11C 11/161; G11C 11/401
See application file for complete search history.

(56) References Cited

U.S. PATENT DOCUMENTS

| | | | |
|---|---|---|---|
| 6,502,161 B1 * | 12/2002 | Perego | ................ G06F 13/1673 711/5 |
| 2004/0186956 A1 * | 9/2004 | Perego | ................ G06F 13/1684 711/115 |
| 2007/0300018 A1 * | 12/2007 | Campbell | ........... G06F 13/1673 711/149 |
| 2009/0154212 A1 * | 6/2009 | Park | ........................ G11C 5/04 365/51 |

\* cited by examiner

*Primary Examiner* — Kenneth T Lam
(74) *Attorney, Agent, or Firm* — Holland & Hart LLP

(57) ABSTRACT

Methods, systems, and devices for compensating for memory input capacitance. Techniques are described herein to alter the capacitance of an access line coupled with a plurality of memory cells. The capacitance of the access line may be filtered by an inductive region, which could be implemented in one or more individual signal paths. Thus a signal may be transmitted to one or more selected memory cells and the inductive region may alter a capacitance of the access line in response to receiving a reflection of the signal from an unselected memory cell. In some examples, the transmitted signal may be modulated using pulse amplitude modulation (PAM), where the signal may be modulated using a modulation scheme that includes at least three levels to encode more than one bit of information (e.g., PAM4).

20 Claims, 12 Drawing Sheets

COMPENSATING FOR MEMORY INPUT CAPACITANCE

BACKGROUND

The following relates generally to using signaling in a memory device. Memory devices are widely used to store information related to various electronic devices such as computers, wireless communication devices, cameras, digital displays, and the like. Information is stored by programming different states of a memory cell.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics.

DETAILED DESCRIPTION

Some memory devices may transfer data across one or more access lines coupled with a memory die utilizing a signal modulated using a modulation scheme that includes at least three levels to encode more than one bit of information. In some examples, such signaling may be configured to increase both signaling performance and power consumption of the memory device. An example of a signaling scheme may be pulse amplitude modulation (PAM), where the signal may be modulated using a modulation scheme that includes at least three levels.

In some examples, some multi-level signaling schemes, such as PAM signaling schemes, may be susceptible to noise sensitivity. For example, a signal may be transmitted to a selected memory cell along an access line that is common to multiple memory cells. In some examples, access lines may be referred to as data lines and may interface a memory chip with one or more external devices (e.g., devices located off-chip). Because the access line may be shared with multiple devices, the selected signal path may be prone to the effects of signal reflection (e.g., noise) from one or more unselected cells (e.g., receiving at least a portion of the signal that was unsuccessfully transmitted to an unselected cell). This may lead to misalignment of the transmission of the signal or adverse effects of a transmitted signal due to noise. Thus reducing the amount of noise received along a particular signal path, for example with use of signaling such as PAM4 signaling, is desirable.

In some examples, implementing an inductive region along one or more signal paths may result in improved signal quality and reduced noise. An inductive region may be introduced as part of the signal paths to compensate for the capacitance of the access line. The inductive region, which may be coil-shaped in some cases, may be coupled with at least one die pad of a memory die. Thus a memory controller may transmit a signal (e.g., a multi-level signal such as a signal modulated using a modulation scheme that includes at least three levels to encode more than one bit of information) through an access line and in turn through the inductive region to the memory die. The inductive region may then serve (e.g., as a type of filter) to prevent a reflection of part of the signal to the access line from an unselected memory cell. This noise reduction may result in increased signal quality of the transmitted data.

Features of the disclosure introduced above are further described below in the context of a memory device. Specific examples are then described for a memory device that supports compensating for memory input capacitance. These and other features of the disclosure are further illustrated by, and described with reference to apparatus diagrams, system diagrams, and flowcharts that relate to signaling.

Figure 1:
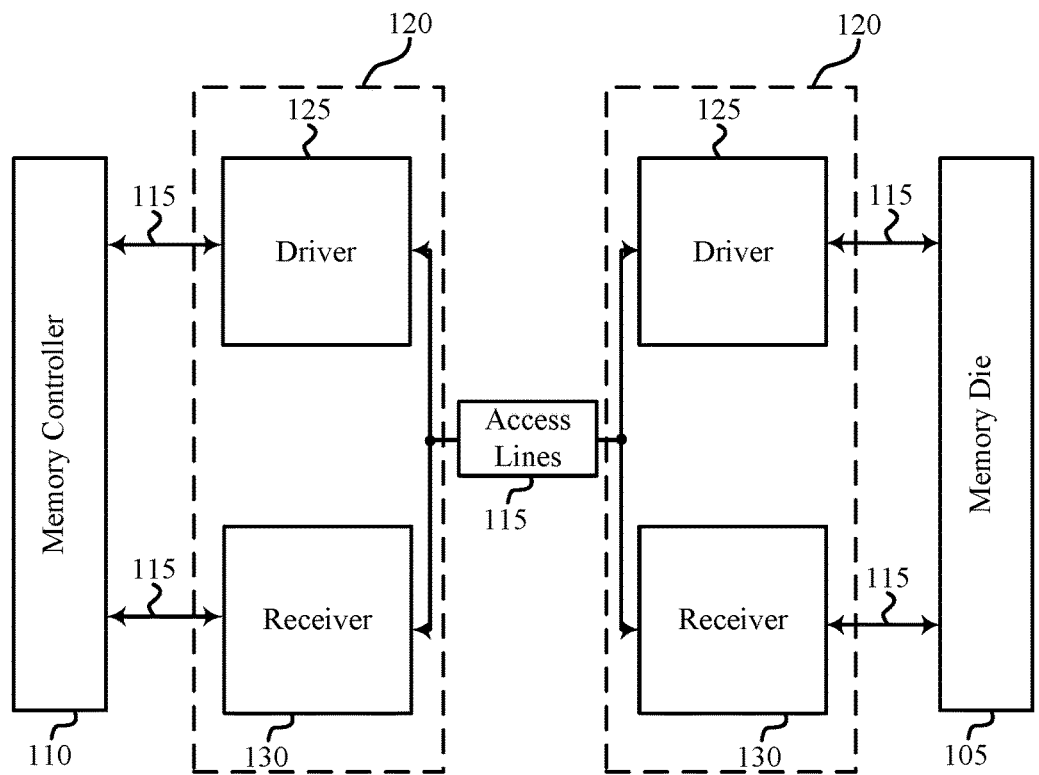
FIG. 1 illustrates an example of a memory device that supports features and operations of compensating for memory input capacitance in accordance with examples of the present disclosure.

FIG. 1 illustrates an example memory subsystem 100 in accordance with various examples of the present disclosure. The memory subsystem 100 may also be referred to as an electronic memory apparatus. The memory subsystem 100 may be configured to utilize multi-level signaling to communicate data between various components of the memory subsystem 100. Some examples of the multi-level signaling may include PAM signaling such as PAM4 signaling, PAM8 signaling, etc. The memory subsystem 100 may include a memory die 105, a controller 110, a plurality of access lines 115, signaling interfaces 120, other components, or a combination thereof.

A memory subsystem 100 may use multi-level signaling to increase an amount of information transmitted using a given bandwidth of frequency resources. In binary signaling, two symbols of a signal (e.g., two voltages levels) are used to represent up to two logic states (e.g., logic state '0' or logic state '1'). In multi-level signaling, a larger library of symbols may be used to represent data. Each symbol may represent more than two logic states (e.g., logic states with multiple bits). For example, if the signal is capable of four unique symbols, the signal may be used to represent up to four logic states (e.g., '00', '01', '10', and '11'). As a result, multiple bits of data may be compressed into a single symbol, thereby increasing the amount of data communicated using a given bandwidth.

In some cases of multi-level signaling, the amplitude of the signal may be used to generate the different symbols. For example, a first amplitude level may represent '00', a second amplitude level may represent '01', a third amplitude level may represent '10', and a fourth amplitude level may represent '11'. One drawback of some multi-level signaling schemes is that the symbols may be separated by a smaller voltage than symbols in a binary signaling scheme. The smaller voltage separation may make the multi-level signaling scheme more susceptible to errors caused by noise or other aspects. The voltage separation of symbols in the multi-level signaling scheme, however, may be expanded by increasing a peak-to-peak transmitted power of a transmitted signal. In some situations, however, such an increase in peak-to-peak transmitted power may not be possible or may be difficult due to fixed power supply voltages, fixed signal power requirements, or other factors. Consequently, to implement multi-level signaling a transmitter may utilize more power and/or a receiver may be susceptible to an increased error rate, when compared to a binary signaling scheme.

Each memory cell of the memory die 105 may be programmable to store different states. For example, each memory cell may be programmed to store two or more logic states (e.g., a logic '0', a logic '1', a logic '00', a logic '01', a logic '10', a logic '11', etc.). A memory cell may store a charge representative of the programmable states in a capacitor; for example, a charged and uncharged capacitor may represent two logic states, respectively. The memory cells of the memory die 105 may use any number of storage mediums including DRAM, FeRAM, PCM, or other types of memory cells. A DRAM memory cell may include a capacitor with a dielectric material as the insulating material. For example, the dielectric material may have linear or para-electric electric polarization properties and a ferroelectric memory cell may include a capacitor with a ferroelectric material as the insulating material. In instances where the storage medium includes FeRAM, different levels of charge of a ferroelectric capacitor may represent different logic states.

The memory die 105 may be or include a three-dimensional (3D) array, where multiple two-dimensional (2D) arrays or multiple memory cells are formed on top of one another. Such a configuration may increase the number of memory cells that may be formed on a single die or substrate as compared with 2D arrays. In turn, this may reduce production costs or increase the performance of the memory array, or both. Each level of the array may be aligned or positioned so that memory cells may be approximately aligned with one another across each level, forming a memory cell stack.

In some examples, the memory die 105 may include a memory cell, a word line, a digit line, and a sense component. In some examples, the memory die 105 may include a plate line (e.g., in the case of FeRAM). A memory cell of the memory die 105 may include a selection component and a logic storage component, such as capacitor that includes a first plate, a cell plate, a second plate, and a cell bottom. The cell plate and cell bottom may be capacitively coupled through an insulating material (e.g., dielectric, ferroelectric, or PCM material) positioned between them.

The memory cell of the memory die 105 may be accessed (e.g., during a read operation, write operation, or other operation) using various combinations of word lines, digit lines, and/or plate lines. In some cases, some memory cells may share access lines (e.g., digit lines, word lines, plate lines) with other memory cells. For example, a digit line may be shared with memory cells in a same column, a word line may be shared with memory cells in a same row, and a plate line may be shared with memory cells in a same section, tile, deck, or multiple decks. As described above, various states may be stored by charging or discharging the capacitor of the memory cell.

The stored state of the capacitor of the memory cell may be read or sensed by operating various elements. The capacitor may be in electronic communication with a digit line. The capacitor may be isolated from digit line when selection component is deactivated, and capacitor can be connected to digit line when selection component is activated (e.g., by the word line). Activating selection component may be referred to as selecting a memory cell. In some cases, the selection component may be a transistor and its operation may be controlled by applying a voltage to the transistor gate, where the voltage magnitude is greater than the threshold magnitude of the transistor. The word line may activate the selection component; for example, a voltage applied to a transistor gate of a word line may connect a capacitor of a memory cell with a digit line.

The change in voltage of a digit line may, in some examples, depend on its intrinsic capacitance. That is, as charge flows through the digit line, some finite charge may be stored in the digit line and the resulting voltage depends on the intrinsic capacitance. The intrinsic capacitance may depend on physical characteristics, including the dimensions, of the digit line. The digit line may connect many memory cells of the memory die 105 so digit line may have a length that results in a non-negligible capacitance (e.g., on the order of picofarads (pF)). The resulting voltage of the digit line may then be compared to a reference voltage (e.g., a voltage of a reference line) by a sense component in order to determine the stored logic state in the memory cell. Other sensing processes may be used.

The sense component may include various transistors or amplifiers to detect and amplify a difference in signals, which may be referred to as latching. The sense component may include a sense amplifier that receives and compares the voltage of the digit line and a reference line, which may be a reference voltage. The sense amplifier output may be driven to the higher (e.g., a positive) or lower (e.g., negative or ground) supply voltage based on the comparison. For instance, if the digit line has a higher voltage than reference line, then the sense amplifier output may be driven to a positive supply voltage.

In some cases, the sense amplifier may drive the digit line to the supply voltage. The sense component may then latch the output of the sense amplifier and/or the voltage of the digit line, which may be used to determine the stored state in the memory cell (e.g., logic '1'). Alternatively, for example, if the digit line has a lower voltage than reference line, the sense amplifier output may be driven to a negative or ground voltage. The sense component may similarly latch the sense amplifier output to determine the stored state in the memory cell (e.g., logic '0'). The latched logic state of the memory cell may then be output, for example, through a column decoder.

To write a memory cell, a voltage may be applied across the capacitor of the memory cell. Various methods may be used to write a memory cell. In one example, the selection component may be activated through a word line in order to electrically connect the capacitor to the digit line. A voltage may be applied across the capacitor by controlling the voltage of the cell plate (e.g., through a plate line) and the cell bottom (e.g., through a digit line). To write a logic '0', the cell plate may be taken high (e.g., a voltage level may be increased above a predetermined voltage that is a "high" voltage). That is, a positive voltage may be applied to plate line, and the cell bottom may be taken low (e.g., virtually grounding or applying a negative voltage to the digit line). The opposite process may be performed to write a logic '1', where the cell plate is taken low and the cell bottom is taken high.

The controller 110 may control the operation (e.g., read, write, re-write, refresh, decharge, etc.) of memory cells in the memory die 105 through the various components (e.g., row decoders, column decoders, and sense components). In some cases, one or more of the row decoder, column decoder, and sense component may be co-located with the controller 110. Controller 110 may generate row and column address signals in order to activate the desired word line and digit line. In other examples, controller 110 may generate and control various voltages or currents used during the operation of memory subsystem 100.

For example, controller 110 may apply discharge voltages to a word line or digit line after accessing one or more memory cells. In general, the amplitude, shape, or duration of an applied voltage or current discussed herein may be adjusted or varied and may be different for the various operations discussed in operating the memory subsystem 100. Further, one, multiple, or all memory cells within the memory die 105 may be accessed simultaneously. For example, multiple memory cells or all memory cells of the memory die 105 may be accessed simultaneously during a reset operation in which multiple memory cells or all memory cells may be set to a single logic state (e.g., logic '0').

One or more memory cells of memory die 105 may be accessed via memory controller 110. For example, the memory controller 110 may be coupled with the access line 115 and may be operable to transmit a signal modulated with a modulation scheme having at least three levels through the access line 115 to the memory die 105. The access line 115 may comprise an inductive region (not shown) that is configured to alter a capacitance of the line based at least in part on the transmission of the signal from the memory controller 110. The capacitance of the access line 115 may be altered, for example, to diminish a reflection from an unselected memory cell. For example, at least a portion of the signal may be transmitted along a signal path of an unselected memory cell. Because the cell is unselected, it is unable to receive the signal. Thus, the signal may be returned (e.g., reflected) and may be received by the access line 115 of the selected memory cell. Thus the a access line 115 may receive a reflection of the signal from an unselected memory cell and the inductive region may adjust a capacitance of the access line 115. Additionally or alternatively, the capacitance across access line 115 may be referred to as input capacitance. In some examples, input capacitance may refer to a parasitic capacitance of the access line 115, and the methods described herein may be implemented to improve the input and output characteristics of the access line 115.

In some examples, at least some (and in some cases, each) of the signaling interfaces 120 may generate and/or decode signals communicated using the plurality of access lines 115. A signaling interface 120 may be associated with each component that is coupled with the plurality of access lines 115. The signaling interface 120 may be configured to generate and/or decode multi-level signals, binary signals, or both (e.g., simultaneously). Each signaling interface 120 may include a driver 125 and a receiver 130.

Each driver 125 may be configured to generate a signal based on a logic state that includes multiple bits. For example, driver 125 may use PAM signaling techniques to generate a signal having an amplitude that corresponds to the logic state. The driver 125 may be configured to receive data using a single input line. In some cases, the driver 125 may include a first input line for a first bit of data (e.g., most-significant bit), a second input line for a second bit of data (e.g., least-significant bit). In some circumstances, the driver 125 may be configured to generate a binary signal (e.g., a non-return to zero (NRZ) signal).

Each receiver 130 may be configured to determine a logic state represented by the multi-level signal received using the plurality of access lines 115. Stated another way, a plurality of access lines may collectively transmit a single multi-level signal. Accordingly, each receiver 130 may be configured to determine a logic state represented by the received multi-level signal. The receiver 130 may determine an amplitude of the received multi-level signal. Based on the determined amplitude, the receiver 130 may determine the logic state represented by the multi-level signal. The receiver 130 may be configured to output data using a single output line. In some cases, the receiver 130 may include a first output line for a first bit of data (e.g., most-significant bit), a second output line for a second bit of data (e.g., least-significant bit). In some circumstances, the receiver 130 may be configured to decode a binary signal (e.g., an NRZ signal).

In some cases, each of the signaling interfaces 120 may be configured to selectively generate and/or decode different types of signals (e.g., NRZ signals, PAM4 signals, PAM8 signals, etc.). Different types of signals may be used based on the operational circumstances of the memory subsystem 100. For example, binary signaling may use less power than multi-level signaling and may be used when power consumption is driving consideration for performance. Other performance factors that may be used to determine which type of signaling should be used may include clock considerations, data strobe (DQS) considerations, circuit capabilities, bandwidth considerations, jitter considerations, or combinations thereof. In some cases, the controller 110 may be configured to select the type of signal, and the signaling interfaces 120 may be configured to implement the selection based on instructions received from the controller 110. In some cases, each of the signaling interfaces 120 may be configured to implement coding functions such as error detection procedures, error correction procedures, data bus inversion procedures, or combinations thereof.

In some cases, the signaling interfaces 120 may be configured to communicate multi-level signals and binary signals simultaneously. In such cases, a signaling interface 120 may include more than one set of drivers 125 and receivers 130. For example, a signaling interface 120 may be configured to communicate a first set of data (e.g., a control signal) using a binary signal using a first set of access lines 115 at the same time that a second set of data (e.g., user information) is being communicated using a multi-level signal using a second set of access lines 115.

Figure 2:
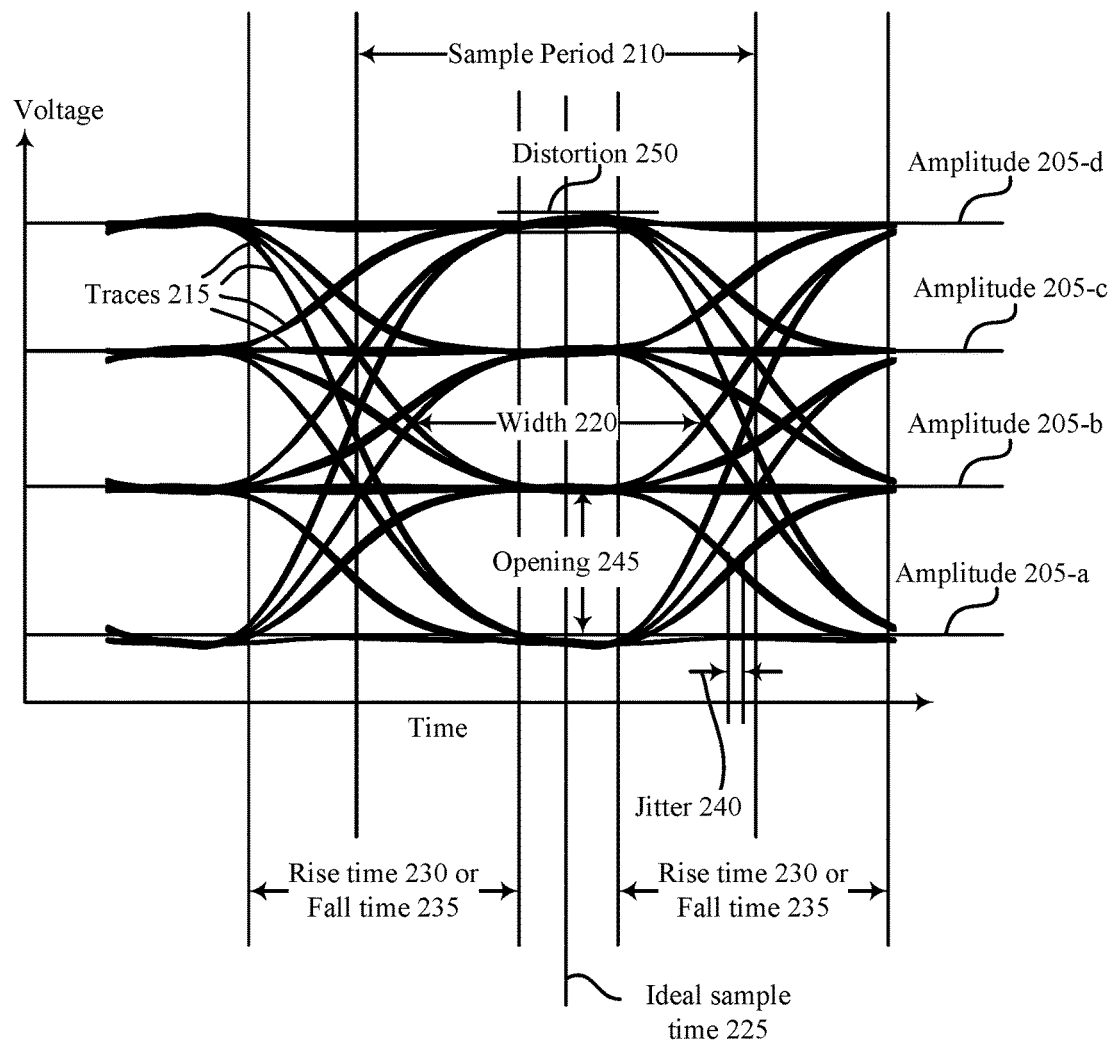
FIG. 2 illustrates an example of an eye diagram for a cell that supports features and operations of compensating for memory input capacitance in accordance with examples of the present disclosure.

FIG. 2 illustrates an example of an eye diagram 200 representing a multi-level signal in accordance with various examples of the present disclosure. The eye diagram 200 may be used to indicate the quality of signals in high-speed transmissions and may represent four symbols of a signal (e.g., '00', '01', '10', or '11'). In some examples, each of the four symbols may be represented by a different voltage amplitude (e.g., amplitudes 205-*a*, 205-*b*, 205-*c*, 205-*d*). In other examples, the eye diagram 200 may represent a PAM4 signal that may be used to communicate data in a memory device (e.g., memory subsystem 100 as described with reference to FIG. 1). The eye diagram 200 may be used to provide a visual indication of the health of the signal integrity, and may indicate noise margins of the data signal. The noise margin may, for example, refer to an amount by which the signal exceeds the ideal boundaries of the amplitudes 205.

To generate the eye diagram 200, an oscilloscope or other computing device may sample a digital signal according to a sample period 210 (e.g., a unit interval or a bit period). The sample period 210 may be defined by a clock associated with the transmission of the measured signal. In some examples, the oscilloscope or other computing device may measure the voltage level of the signal during the sample period 210 to form a trace 215. Noise and other factors can result in the traces 215 measured from the signal deviating from a set of ideal step functions. By overlaying a plurality of traces 215, various characteristics about the measured signal may be determined. For example, the eye diagram 200 may be used to identify a number of characteristics of a communication signals such as jitter, cross talk, electromagnetic interference (EMI), signal loss, signal-to-noise ratio (SNR), other characteristics, or combinations thereof. A closed eye may indicate a noisy and/or unpredictable signal or other problems.

In some examples, the eye diagram 200 may indicate a width 220. The width 220 of an eye in the eye diagram 200 may be used to indicate a timing synchronization of the measured signal or jitter effects of the measured signal. In some examples, comparing the width 220 to the sample period 210 may provide a measurement of SNR of the measured signal. Each eye in an eye diagram may have a unique width based on the characteristics of the measured signal. Various encoding and decoding techniques may be used to modify the width 220 of the measured signal.

As discussed above, a memory device (e.g., memory subsystem 100 as described with reference to FIG. 1) may be configured to transmit a signal to one or more memory cells. For example, the memory device may include a memory controller (e.g., a memory controller 110 as described with reference to FIG. 1) and a memory die (e.g., a memory die 105 as described with reference to FIG. 1) comprising one or more memory cells. The memory controller may be configured to transmit the multi-level signal—a signal modulated with a modulation scheme having at least three levels—through an access line (e.g., access line 115 as described with reference to FIG. 1) to a selected memory cell. The access line may include an inductive region configured to alter a capacitance of the access line based at least in part on the transmission of the signal. As described above, the signal may be a signal modulated with a modulation scheme having at least three levels (e.g., a PAM4 signal) or, in other examples, may be a signal modulated with a modulation scheme having less than three levels (e.g., an NRZ signal). For example, the inductive region may alter a capacitance of the access line based on receiving a reflection of the signal from an unselected memory cell. Though the inductive region may improve signal quality, generally, the low-pass filter of the access line may specifically improve uniformity in the eye width 220.

In other examples, the eye diagram 200 may indicate a sampling time 225 (e.g., an ideal sampling time) for determining the value of a logic state represented in the measured signal. For example, determining a correct time for sampling data (e.g., timing synchronization) of the measured signal may be important to minimize the error rate in detection of the signal. For example, if a computing device samples a signal during a transition time (e.g., a rise time 230 or a fall time 235), errors may be introduced by the decoder into the data represented by the signal. Various encoding and decoding techniques may be used to modify the ideal sampling time 225 of the measured signal.

The eye diagram 200 may be used to identify a rise time 230 and/or a fall time 235 for transitions from a first amplitude 205 to a second amplitude 205. The slope of the trace 215 during the rise time 230 or fall time 235 may indicate the signal's sensitivity to timing error, among other aspects. For example, the steeper the slope of the trace 215 (e.g., the smaller the rise time 230 and/or the fall times 235), the more ideal the transitions between amplitudes 205 are. Various encoding and decoding techniques may be used to modify the rise time 230 and/or fall time 235 of the measured signal.

In some examples, the eye diagram 200 may be used to identify an amount of jitter 240 in the measured signal. Jitter 240 may refer to a timing error that results from a misalignment of rise and fall times. Jitter 240 occurs when a rising edge or falling edge occurs at a time that is different from an ideal time defined by the data clock. Jitter 240 may be caused by signal reflections, intersymbol interference, crosstalk, process-voltage-temperature (PVT) variations, random jitter, additive noise, or combinations thereof. Various encoding and decoding techniques may be used to modify the jitter 240 of the measured signal.

In other examples, the eye diagram 200 may indicate an eye opening 245, which may represent a peak-to-peak voltage difference between the various amplitudes 205. The eye opening 245 may be related to a voltage margin for discriminating between different amplitudes 205 of the measured signal. The smaller the margin, the more difficult it may be to discriminate between neighboring amplitudes, and the more errors that may be introduced due to noise. In some cases, a receiver (e.g., receiver 130 as described with reference to FIG. 1) of the signal may compare the signal to one or more threshold voltages positioned between the various amplitudes 205. In other cases, the larger the eye opening 245, the less likely it is that noise will cause the one or more voltage thresholds to be satisfied in error. The eye opening 245 may be used indicate an amount of additive noise in the measured signal, and may be used to determine a SNR of the measured signal. Various encoding and decoding techniques may be used to modify the eye opening 245 of the measured signal.

Additionally or alternatively, for example, as discussed above the memory controller may be configured to transmit the signal through an access line (e.g., access line 115 as described with reference to FIG. 1). The signal may be represented by eye diagram 200. Because the access line may include an inductive region, which may be configured to alter a capacitance of the access line based at least in part on the transmission of the signal, the eye opening 245 may be improved (e.g., widened). For example, the inductive region may alter a capacitance of the access line based on receiving a reflection of the signal from an unselected memory cell. Though the inductive region may improve signal quality, generally, the inductive region of the access line may improve uniformity in the eye opening 245.

In other examples, the eye diagram 200 may indicate distortion 250. The distortion 250 may represent overshoot and/or undershoot of the measured signal due to noise or interruptions in the signal path. As a signal settles into a new amplitude (e.g., amplitude 205-b) from an old amplitude (e.g., an amplitude 205-c), the signal may overshoot and/or undershoot the new amplitude level. In some examples, distortion 250 may be caused by this overshooting and/or undershooting, and may be caused additive noise in the signal or interruptions in the signal path. Each eye in an eye diagram may have a unique opening based on the characteristics of the measured signal. Various encoding and decoding techniques may be used to modify the distortion 250 of the measured signal.

Figure 3:
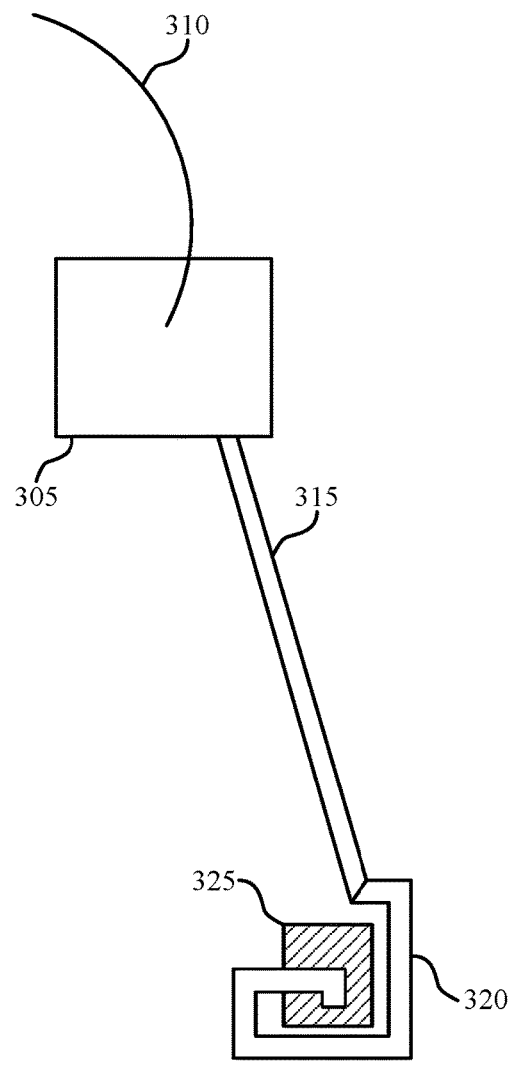
FIG. 3 illustrates an example of a memory device that supports compensating for memory input capacitance in accordance with examples of the present disclosure.

FIG. 3 illustrates an example of a memory device 300 that supports compensating for memory input capacitance in accordance with various examples of the present disclosure. In some examples, FIG. 3 illustrates an example of a memory subsystem 100 as described with reference to FIG. 1. The memory device 300 may include a bond pad 305, a bond wire 310, an access line 315, an inductive region 320, and a die pad 325, among other aspects.

The memory device 300 may be coupled with a memory die (e.g., a memory die 105 as described with reference to FIG. 1) and a substrate (not shown). For example, the memory device 300 may be coupled with the memory die through the die pad and to the substrate through the bond wire 310. In other examples, the memory device 300 may be coupled with a memory controller (e.g., a memory controller 110 as described with reference to FIG. 1) and may be configured to receive one or more signals transmitted from the memory controller. In either example, the bond pad 305 may be configured to receive one or more signals from a memory controller.

In some examples, the memory device 300 may be an example of one or more elements that relates to a particular signal path to one or more memory cells (not shown). For example, the bond pad 305 may be coupled with a memory controller and an access line 315, which may include an inductive region 320. The inductive region may be coupled with a memory die through a die pad 325. The memory controller may be configured to transmit a signal modulated with a modulation scheme having at least three levels through the access line 315 to one or more memory cells of the memory die. In other examples, the memory controller may be configured to transmit a signal modulated with a modulation scheme having multiple levels. In some examples, the signal modulated with a modulation scheme having at least three levels may be referred to as a multi-level signal. The signal may be transmitted from the memory controller through the inductive region 320 via the access line 315. In some examples, the signal may be transmitted to a selected memory cell.

In some examples, however, at least a portion of the signal (or another distinct signal, or both) may be inadvertently received by a signal path of an unselected memory cell. In such an example, the signal may not be received by the cell, itself, but rather at least part of the signal may be reflected back to the access line 315 in the form of noise. In such an example, the inductive region 320 may serve to alter a capacitance of the access line 315 based at least in part on the transmission of the signal from the memory controller.

For example, a signal (e.g., a signal modulated with a modulation scheme having at least three levels) may be transmitted to a selected memory cell via the access line 315. At least a portion of the signal may be received by an access line coupled with a second, unselected memory cell. The signal may be reflected back (e.g., in the form of noise), and would otherwise increase a capacitance across the access line 315. For example, the signal may be reflected off of an impedance discontinuity that may result from parasitic capacitance located at a ball grid array (BGA) pad (not shown), the die pad 325, epoxy mold compound (EMC) (not shown), or I/O circuitry (not shown). In such an example, the inductive region 320 may serve (e.g., as a type of filter) to adjust the capacitance across access line 315 and prevent or mitigate unwanted noise in the signal being inadvertently reflected to the selected memory cell.

In other examples, a second memory die may be coupled with the substrate and may be configured to receive a second signal. In some examples, the second memory die may be located in a second layer that is coupled with a substrate. Additionally or alternatively, for example, each of the first signal and the second signal may be signals modulated with a modulation scheme having at least three levels. The second memory die may be coupled with a second access line that may include a second bond pad (not shown) coupled with a second access line (not shown) having a second inductive region (not shown). In some examples, the memory controller may be configured to transmit the signal to the first memory die, which may otherwise result in an increased capacitance across the second access line. In such an example, however, the second inductive region may be configured to alter a capacitance of the second access line based at least in part on the transmission of the signal to the first memory die. In other examples, altering a capacitance of the second access line may include canceling the capacitance of the second access line based at least in part on the transmission of the signal to the first memory die and, in other examples, altering a capacitance of the second access line may include compensating for the increased capacitance across the second access line.

In some examples, the inductive region 320 may be configured in the shape of a coil. The shape may also be described as being helical, spiral, curled, or wound. In other examples, the inductive region 320 may comprise a first inductive segment extending in a first direction, and a second inductive segment extending in a second direction different from the first direction. For example, the first direction may be orthogonal to the second direction. In some examples, as described above, the inductive region 320 may be configured to alter a capacitance of the access line 315 based at least in part on the transmission of a signal—a signal modulated with a modulation scheme having at least three levels, for example—from a memory controller. In other examples, the inductive region may alter a capacitance of a second access line based at least in part on the transmission of the signal to the access line 315. In some examples, the access line 315 may be coupled with a die pad 325, which may be embedded within a substrate (not shown), or may be located between a substrate and a memory die (not shown). In other examples, the inductive region 320 may be located above a die pad 325 in a z-direction.

In some examples, the access line may include a redistribution layer (RDL) coupled with the die pad 325. The RDL may, for example, be or include an interface between the access line 315 and memory die and may include one or more metal and/or dielectric layers to facilitate the transmission of a signal across the access line 315. In some examples, the metals may include, for example, copper (Cu) or aluminum (Al). In some examples, the RDL may be referred to as a inline RDL (iRDL) and may allow for multiple memory dies to be stacked in a single package. In some examples, the use of a RDL or iRDL may allow for flip-chip applications and may support high input/output (I/O) count memory chips.

Figure 4:
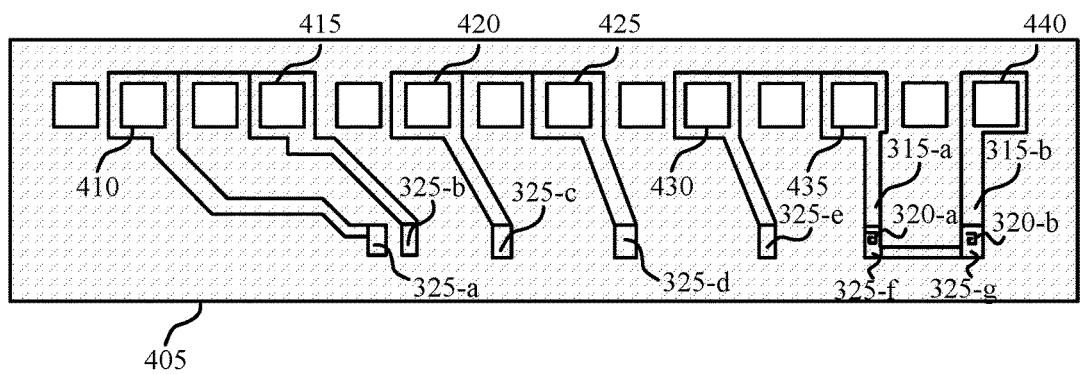
FIG. 4 illustrates an example of a memory device that supports compensating for memory input capacitance in accordance with examples of the present disclosure.

FIG. 4 illustrates an example of a memory device 400 that supports compensating for memory input capacitance in accordance with various examples of the present disclosure. In some examples, FIG. 4 illustrates an example of a memory device 300 as described with reference to FIG. 3. The memory device 300 may include a substrate 405, data I/O pins 410, 415, 420, 425, 430, 435, and 440, and die pads 325-a, 325-b, 325-c, 325-d, 325-e, 325-f, and 325-g. In some examples, each of die pads 325-a, 325-b, 325-c, 325-d, 325-e, 325-f, and 325-g may be an example of die pad 325 as described with reference to FIG. 3. Additionally or alternatively, for example, each of data I/O pins 410, 415, 420, 425, 430, 435, and 440 may be coupled with each of die pads 325-a, 325-b, 325-c, 325-d, 325-e, 325-f, and 325-g through an access line. For example, data I/O pins 435 and 440 may be coupled with die pads 325-f and 325-g through access lines 315-a and 315-b, respectively. Each of access lines 315-a and 315-b may be an example of access line 315 as described with reference to FIG. 3. In some examples, one or more of die pads 325-a, 325-b, 325-c, 325-d, 325-e, 325-f, and 325-g may be coupled with an inductive region. For example, die pads 325-f and 325-g may be coupled with inductive regions 320-a and 320-b, respectively. In some examples, inductive regions 320-a and 320-b may be examples of inductive region 320 as described with reference to FIG. 3.

As described above, a memory controller may be configured to transmit a signal modulated with a modulation scheme having at least three levels through an access line (e.g., an access line 315 as described with reference to FIG. 3) to one or more memory cells of a memory die. In some examples, the signal may be transmitted from the memory controller and through access lines to one or more selected memory cells. In some examples, each of data I/O pins 410, 415, 420, 425, 430, 435, and 440 may be configured to receive the signal from the memory controller. Thus a respective access line coupled with a data I/O pin may be configured to transmit the signal to a die pad and ultimately to a selected memory cell.

In some examples, one or more of the die pads 325-a, 325-b, 325-c, 325-d, 325-e, 325-f, and 325-g may be coupled with an inductive region (e.g., the inductive region 320 as described with reference to FIG. 3). Stated alternatively, one or more of the access lines may include an inductive region coupled with one of the die pads 325-a, 325-b, 325-c, 325-d, 325-e, 325-f, and 325-g. One or more of the inductive regions, as described above, may be configured to alter a capacitance of a respective access line based at least in part on the transmission of a signal from the memory controller.

As described above, one or more of the access lines may include an inductive region. In some examples, each of die pads 325-a, 325-b, 325-c, 325-d, 325-e, 325-f, and 325-g may be coupled with an inductive region of a respective access line. In other examples, one of die pads 325-a, 325-b, 325-c, 325-d, 325-e, 325-f, and 325-g may be coupled with an inductive region of a respective access line. In another example, several of die pads 325-a, 325-b, 325-c, 325-d, 325-e, 325-f, and 325-g may be coupled with an inductive region of a respective access line.

For example, die pads 325-f and 325-g may be coupled with inductive regions 320-a and 320-b, respectively. The access line 315-a may be coupled with data I/O pin 435 and the access line 315-b may be coupled with data I/O pin 440. In some examples, die pad 325-f may be coupled with a first memory cell and die pad 325-g may be coupled with a second memory cell. As described above, data I/O pins 435 and 440 may be configured to receive a signal from a memory controller (e.g., a memory controller 110 as described with reference to FIG. 1). Thus, for example, the first memory cell may be selected and data I/O pin 435 may receive, from the memory controller, a signal modulated with a modulation scheme having at least three levels. The signal may be transmitted through the access line 315-a and inductive region 320-a coupled with the die pad 325-f and to the first memory cell. In some examples, at least a portion of the signal may be inadvertently reflected to the access line 315-b coupled with the die pad 325-g and the second, unselected, memory cell. In such an example, the access line 315-a coupled with the die pad 325-f may otherwise receive a reflection of the signal, altering the capacitance across the line. However, the inductive region 320-a coupled with the die pad 325-f may be configured to alter a capacitance of the access line 315-a based at least in part on the transmission of the signal. As described above, the signal may be a PAM signal or, in other examples, may be a binary signal (e.g., an NRZ signal). Thus the quality of the signal transmitted to the selected memory cell may be improved.

Figure 5:
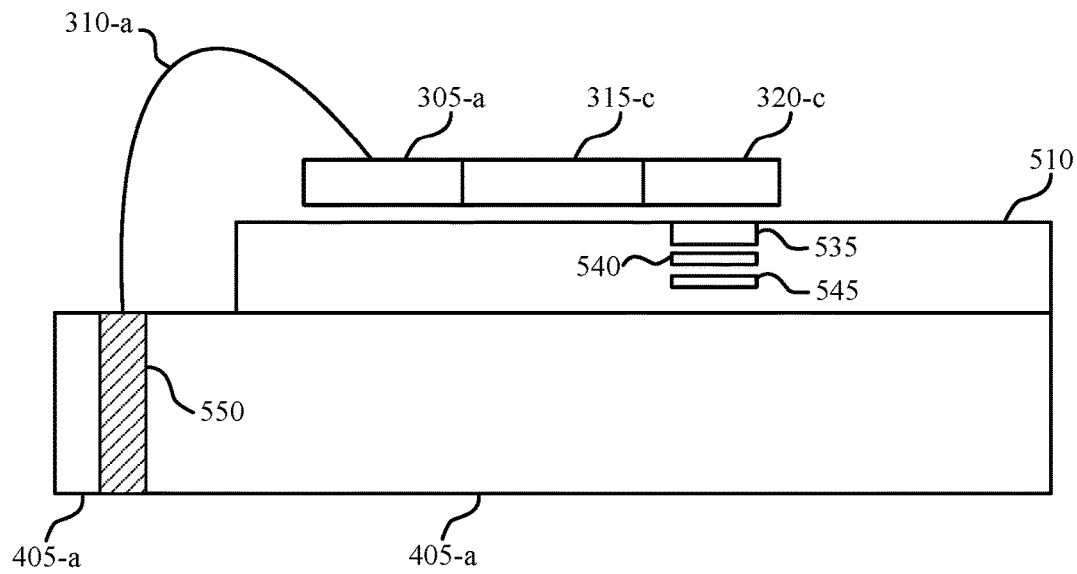
FIG. 5 illustrates an example of a memory device that supports compensating for memory input capacitance in accordance with examples of the present disclosure.

FIG. 5 illustrates an example of a memory device 500 that supports compensating for memory input capacitance in accordance with various examples of the present disclosure. In some examples, FIG. 5 illustrates an example of a memory device 300 as described with reference to FIG. 3. The memory device 500 may include a substrate 405-a, memory die 510, bond pad 305-a, access line 315-c, inductive region 320-c, bond wire 310-a, metal layers 535, 540, and 545, and routing 550. In some examples, the substrate 405-a may be an example of the substrate 405 as described with reference to FIG. 4, and the bond pad 305-a, access line 315-c, inductive region 320-c and bond wire 310-a may be examples of the bond pad 305, the access line 315, the inductive region 320, and the bond wire 310, respectively, as described with reference to FIG. 3.

In some examples, the memory device 500 may be configured such that the memory die 510 is positioned above the substrate 405-a and the bond pad 305-a, access line 315-c, and inductive region 320-c are positioned above the memory die 510. In other examples, the memory device 500 may be configured such that the access line 315-c is coupled with a pad of the memory die and the inductive region is in contact with the substrate 405-a coupled with the memory die 510. In another example, the bond pad 305-a may be coupled with the substrate 405-a via the bond wire 310-a and the inductive region 320-c may be coupled with a metal layer 535. In some examples, the metal layer 535 may include or be referred to as a die pad (e.g., similar to or the same as die pad 325, among other examples).

In some examples, the memory device may be an example of one or more elements that relates to a particular signal path to one or more memory cells (not shown) of the memory die 510. For example, the bond pad 305-*a* may be coupled with a memory controller via the bond wire 310-*a* and may be further-coupled with the access line 315-*c*. In some examples, the access line 315-*c* may be or may include an RDL or iRDL layer, and may be coupled with the inductive region 320-*c*. As described above with reference to FIG. 3, the inductive region 320-*c* may be coil-shaped. In other examples, the inductive region 320-*c* may be one of a variety of shapes. For example, the inductive region 320-*c* may be rectangular, square, or s-shaped. In other examples, the inductive region 320-*c* may vary in thickness and/or material type. In other examples, the inductive region 320-*c* may be coupled with the memory die 510 through the metal layer 535 (e.g., die pad) and, in other examples, may be coupled with the memory die through metal layers 540 and/or 545. Additionally or alternatively, for example, the inductive region 320-*c* may be a same size as the metal layer 535.

The memory controller may be configured to transmit a signal modulated with a modulation scheme having at least three levels through the routing 550 and bond wire 310-*a* to the bond pad 305-*a*. The signal may be transmitted to one or more selected memory cells, via the access line 315-*c*, in the memory die 510. Thus the signal may be transmitted from the memory controller through the inductive region 320-*c* via the access line 315-*c*.

As described above, at least a portion of the signal may be inadvertently received by a signal path of an unselected memory cell. In such an example, the signal may be rather reflected back to the access line 315-*c* in the form of noise. Thus the inductive region 320-*c* may serve to alter a capacitance of the access line 315-*c* based at least in part on the transmission of the signal from the memory controller. Thus the inductive region 320-*c* may serve as a filter and adjust the capacitance across the access line 315-*c*, preventing any unwanted noise in the signal being transmitted to the selected memory cell in the memory die 510.

Figure 6:
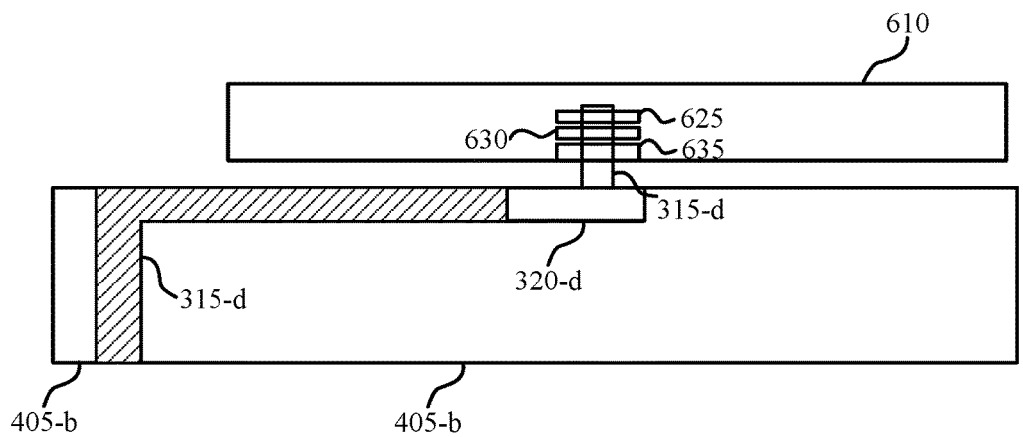
FIG. 6 illustrates an example of a memory device that supports compensating for memory input capacitance in accordance with examples of the present disclosure.

FIG. 6 illustrates an example of a memory device 600 that supports compensating for memory input capacitance in accordance with various examples of the present disclosure. In some examples, FIG. 6 illustrates an example of a memory device 300 as described with reference to FIG. 3. The memory device 600 may include a substrate 405-*b*, memory die 610, access line 315-*d*, inductive region 320-*d*, and metal layers 625, 630, and 635. In some examples, the substrate 405-*b* may be an example of the substrate 405 as described with reference to FIG. 4, and the access line 315-*d* and inductive region 320-*d* may be examples of the access line 315 and the inductive region 320 as described with reference to FIG. 3.

The memory device 600 may be configured such that the memory die 610 is positioned above the substrate 405-*b*, access line 315-*d*, and inductive region 320-*d*. In some examples, the inductive region 320-*d* may be coupled with a metal layer 635. This may be referred to as a "flip-chip" configuration. In some examples, the metal layer 635 may include or be referred to as a die pad 635 (e.g., similar to or the same as die pad 325, among other examples).

In some examples, the memory device 600 may be an example of one or more elements that relates to a particular signal path to one or more memory cells (not shown) of the memory die 610. For example, the access line 315-*d* and inductive region 320-*d* may be embedded within the substrate 405-*b*. In other examples, the access line 315-*d* may be embedded within the substrate and may be or may include an RDL or iRDL layer, and may be coupled with the inductive region 320-*d*. As described above with reference to FIG. 3, the inductive region 320-*d* may be coil-shaped. In other examples, the inductive region 320-*d* may be coupled with the memory die 610 through the die pad 635 and, in other examples, may be coupled with the memory die through metal layers 625 and/or 630.

As described above, the memory controller may be configured to transmit a signal modulated with a modulation scheme having at least three levels through the access line 315-*d*. In some examples, the signal may be transmitted to one or more selected memory cells via the access line 315-*d*. Thus the signal may be transmitted from the memory controller through the inductive region 320-*d* via the access line 315-*d*.

In some examples, at least a portion of the signal may be inadvertently received by a signal path of an unselected memory cell. In such an example, the signal may be rather reflected back to the access line 315-*d* in the form of noise. Thus the inductive region 320-*d* may serve to alter a capacitance of the access line 315-*d* based at least in part on the transmission of the signal from the memory controller. The inductive region 320-*d* may serve as a type of a filter and adjust the capacitance across the access line 315-*d*, preventing any unwanted noise in the signal being transmitted to the selected memory cell in the memory die 610.

Figure 7:
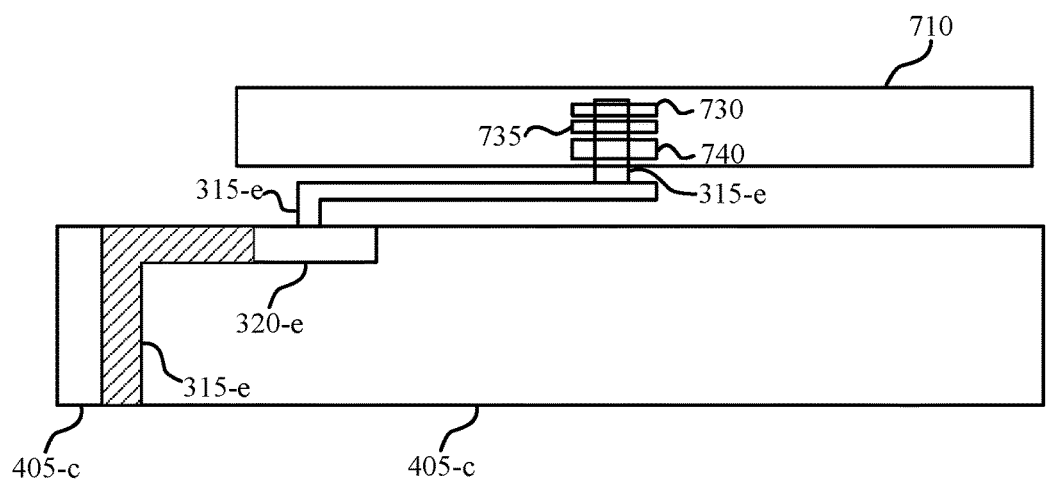
FIG. 7 illustrates an example of a memory device that supports compensating for memory input capacitance in accordance with examples of the present disclosure.

FIG. 7 illustrates an example of a memory device 700 that supports compensating for memory input capacitance in accordance with various examples of the present disclosure. In some examples, FIG. 7 illustrates an example of a memory device 300 as described with reference to FIG. 3. The memory device 700 may include a substrate 405-*c*, memory die 710, access line 315-*e*, inductive region 320-*e*, and metal layers 730, 735, and 740. In some examples, the substrate 405-*c* may be an example of the substrate 405 as described with reference to FIG. 4, and the access line 315-*e* and the inductive region 320-*e* may be examples of the access line 315 and the inductive region 320, respectively, as described with reference to FIG. 3.

The memory device 700 may be configured such that the memory die 710 is positioned above the substrate 405-*c* and the access line 315-*e* and the inductive region 320-*e* are positioned below the memory die 710. Additionally or alternatively, for example, the inductive region 320-*e* and the access line 315-*e* may be embedded within the substrate 405-*c*. In some examples, the inductive region 320-*e* may be coupled with the memory die 710 via the access line 315-*e*. In other examples, the access line 315-*e* may be coupled with the metal layer 740. This may be referred to as a "flip-chip" configuration. In some examples, the metal layer 740 may include or be referred to as a die pad 740 (e.g., similar to or the same as die pad 325, among other examples).

In some examples, the memory device 700 may be an example of one or more elements that relates to a particular signal path to one or more memory cells (not shown) of the memory die 710. For example, the memory die 710 may be coupled with a memory controller via the access line 315-*e* and may be further-coupled with the inductive region 320-*e*. In some examples, the access line 315-*e* may be or may include an RDL or iRDL layer, and may be coupled with the inductive region 320-*e*. As described above with reference to FIG. 3, the inductive region 320-*e* may be coil-shaped. In other examples, the inductive region 320-*e* may be coupled with the memory die 710 through the access line 315-*e* and, in other examples, the access line 315-*e* may be coupled with the memory die 710 through metal layers 730 and/or 735.

The memory controller may be configured to transmit a signal modulated with a modulation scheme having at least three levels through the access line 315-*e* to the memory die 710. The signal may be transmitted to one or more selected memory cells, via the access line 315-*e*, to the memory die 710. Thus the signal may be transmitted from the memory controller through the inductive region 320-*e* via the access line 315-*e*.

As described above, at least a portion of the signal may be inadvertently received by a signal path of an unselected memory cell. In such an example, the signal may be rather reflected back to the access line 315-*e* in the form of noise. Thus the inductive region 320-*e* may serve to alter a capacitance of the access line 315-*e* based at least in part on the transmission of the signal from the memory controller. Thus the inductive region 320-*e* may serve as a filter and adjust the capacitance across the access line 315-*e*, preventing any unwanted noise in the signal being transmitted to the selected memory cell in the memory die 710.

Figure 8:
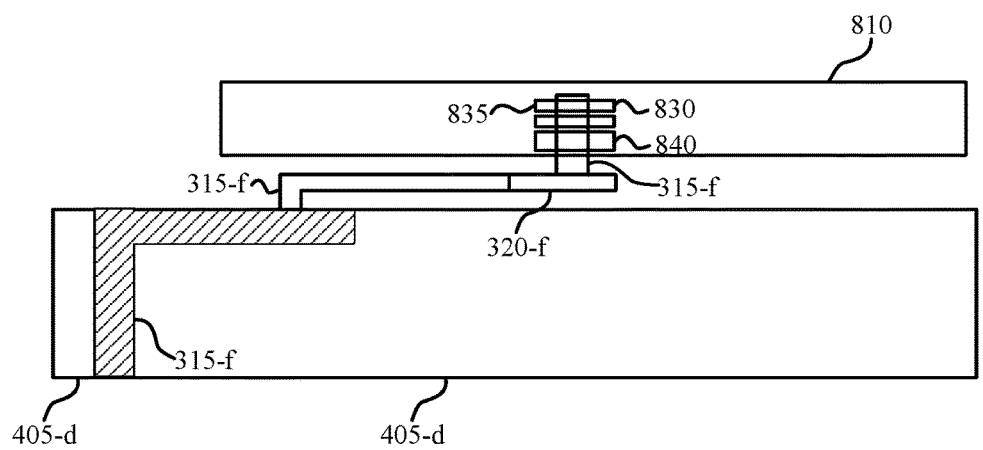
FIG. 8 illustrates an example of a memory device that supports compensating for memory input capacitance in accordance with examples of the present disclosure.

FIG. 8 illustrates an example of a memory device 800 that supports compensating for memory input capacitance in accordance with various examples of the present disclosure. In some examples, FIG. 8 illustrates an example of a memory device 300 as described with reference to FIG. 3. The memory device 800 may include a substrate 405-*d*, memory die 810, access line 315-*f*, inductive region 320-*f*, and metal layers 830, 835, and 840. In some examples, the substrate 405-*d* may be an example of the substrate 405 as described with reference to FIG. 4, and the access line 315-*f* and the inductive region 320-*f* may be examples of the access line 315-*f* and the inductive region 320-*f*, respectively, as described with reference to FIG. 3.

The memory device 800 may be configured such that the memory die 810 is positioned above the substrate 405-*d* and the access line 315-*f* and inductive region 320-*f* are positioned below the memory die 810. In some examples, the access line 315-*f* may be in contact with the substrate 405-*d*. In some examples, the access line 315-*f* may be embedded within the substrate 405-*d*. Thus the inductive region 320-*f* may be coupled with the access line 315-*f*, which may be coupled with the metal layer 840. This may be referred to as a "flip-chip" configuration. In some examples, the metal layer 840 may include or be referred to as a die pad 840 (e.g., similar to or the same as die pad 325, among other examples).

In some examples, the memory device 800 may be an example of one or more elements that relates to a particular signal path to one or more memory cells (not shown) of the memory die 810. For example, the substrate 405-*d* may be coupled with the memory die 810 via the access line 315-*f*, which may be coupled with the inductive region 320-*f* and the memory die 810. In some examples, the access line 315-*f* may be or may include an RDL or iRDL layer, and may be embedded within the substrate 405-*d*. As described above with reference to FIG. 3, the inductive region 320-*f* may be coil-shaped. In some examples, the inductive region 320-*f* may be coupled with each of the access line 315-*f* and the memory die 810. In other examples, the inductive region 320-*f* may be coupled with the memory die 810 through metal layers 830 and/or 835.

The memory controller may be configured to transmit a signal modulated with a modulation scheme having at least three levels through the access line 315-*f* and inductive region 320-*f* to the memory die 810. The signal may be transmitted to one or more selected memory cells in the memory die 810. Thus the signal may be transmitted from the memory controller through the inductive region 320-*f* via the access line 315-*f*.

As described above, at least a portion of the signal may be inadvertently received by a signal path of an unselected memory cell. In such an example, the signal may be rather reflected back to the access line 315-*f* in the form of noise. Thus the inductive region 320-*f* may serve to alter a capacitance of the access line 315-*f* based at least in part on the transmission of the signal from the memory controller. Thus the inductive region 320-*f* may serve as a filter and adjust the capacitance across the access line 315-*f*, preventing any unwanted noise in the signal being transmitted to the selected memory cell in the memory die 810.

Figure 9:
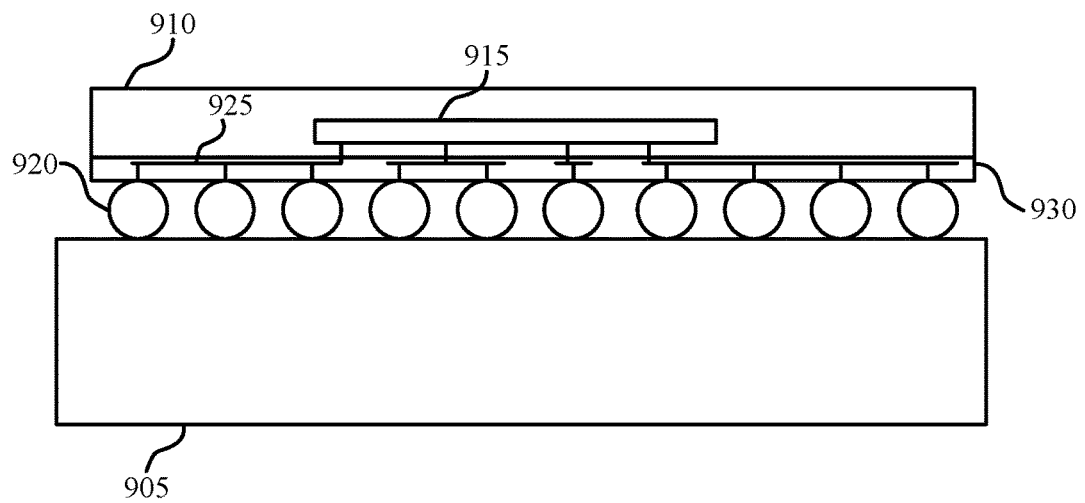
FIG. 9 illustrates an example of a memory device that supports compensating for memory input capacitance in accordance with examples of the present disclosure.

FIG. 9 illustrates an example of a memory device 900 that supports compensating for memory input capacitance in accordance with various examples of the present disclosure. In some examples, FIG. 9 illustrates an example of a memory device 300 as described with reference to FIG. 3. The memory device 900 may include a substrate 905, memory die 910, memory chip 915, connection elements 920, redistribution layers (RDL) 925, and epoxy mold compound (EMC) layer 930. In some examples, the substrate 905 may be an example of the substrate 405 as described with reference to FIG. 4, and memory die 910 may be examples of the memory die as described with reference to FIGS. 5 through 8, among other examples.

The memory device 900 may be configured such that the memory die 910 is coupled with the substrate 905 through connection elements 920. In some examples, this configuration may be referred to as a ball grid array (BGA) pad, which may be coupled with the substrate 905. In such a configuration, the memory die 910 may be embedded in EMC layer 930. In other examples, the RDL 925 may be embedded in EMC layer 930. In some examples, the memory die 910 may be coupled with an access line (e.g., an access line 315 as described with reference to FIG. 3) that includes a RDL or iRDL 925. In some examples, the access line may be coupled with the BGA pad.

In some examples, the memory device 900 may be an example of a single memory die coupled with the substrate 905. In other examples, the memory device 900 may include two or more memory die coupled with the substrate 905. The memory die 910 may be coupled with a memory controller and the RDL 925. In some examples, the RDL 925 may be coupled with or may include an inductive region (not shown). In some examples, the inductive region may be coil-shaped.

The memory controller may be configured to transmit a signal modulated with a modulation scheme having at least three levels through the RDL 925 to the memory die 910. In some examples, the signal may be transmitted to one or more selected memory cells, via the RDL 925. Thus, in some examples, the signal may be transmitted from the memory controller through the inductive region via the RDL 925.

As described above, at least a portion of the signal may be inadvertently received by a signal path of an unselected memory cell. In such an example, the signal may be rather reflected back to the RDL 925 in the form of noise. Thus the inductive region may serve to alter a capacitance of the RDL 925 based at least in part on the transmission of the signal from the memory controller. Thus the inductive region may serve as a filter and adjust the capacitance across the RDL 925, preventing any unwanted noise in the signal being transmitted to the selected memory cell in the memory die 910.

Figure 10:
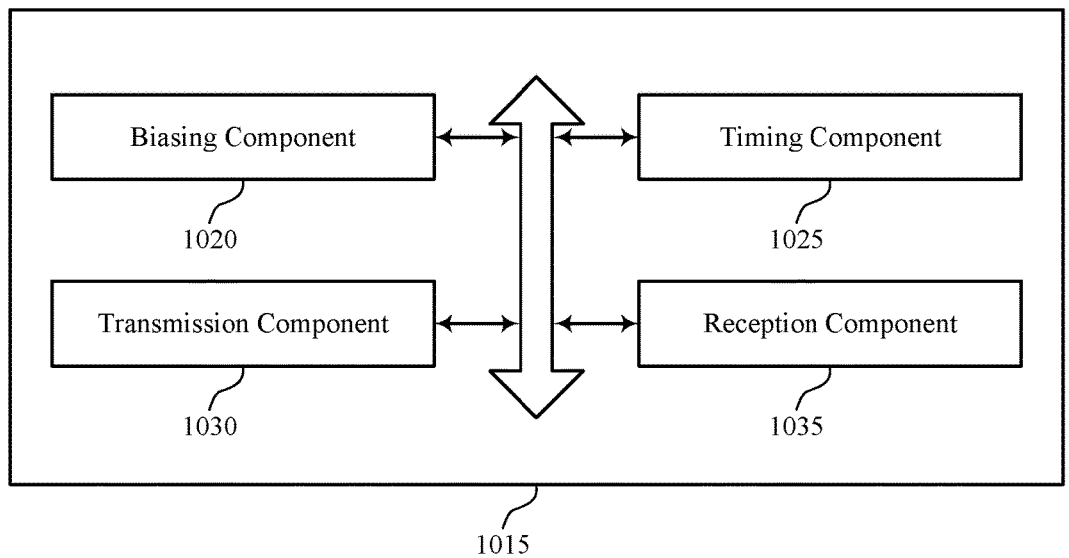
FIG. 10 shows a block diagram of a device that supports compensating for memory input capacitance in accordance with examples of the present disclosure.

FIG. 10 shows a block diagram 1000 of a memory controller 1015 that supports compensating for memory input capacitance in accordance with examples of the present disclosure. The memory controller 1015 may be an example of aspects of a memory controller 110 described with reference to FIG. 1. The memory controller 1015 may include biasing component 1020, timing component 1025, transmission component 1030, and reception component 1035. Each of these modules may communicate, directly or indirectly, with one another (e.g., via one or more buses).

Transmission component 1030 may transmit a signal through an access line to a memory die that is coupled with a substrate. In some examples, the access line may be coupled with an inductive region coupled with the memory die. In other examples, the signal may be modulated with a modulation scheme having at least three levels.

Reception component 1035 may receive the signal at the memory die. In some examples, the inductive region may be configured to alter a capacitance of the access line based on receiving the signal. In other cases, the inductive region may be configured to alter the capacitance of the access line based on receiving a reflection of at least part of the signal from a second memory die coupled with the substrate.

Figure 11:
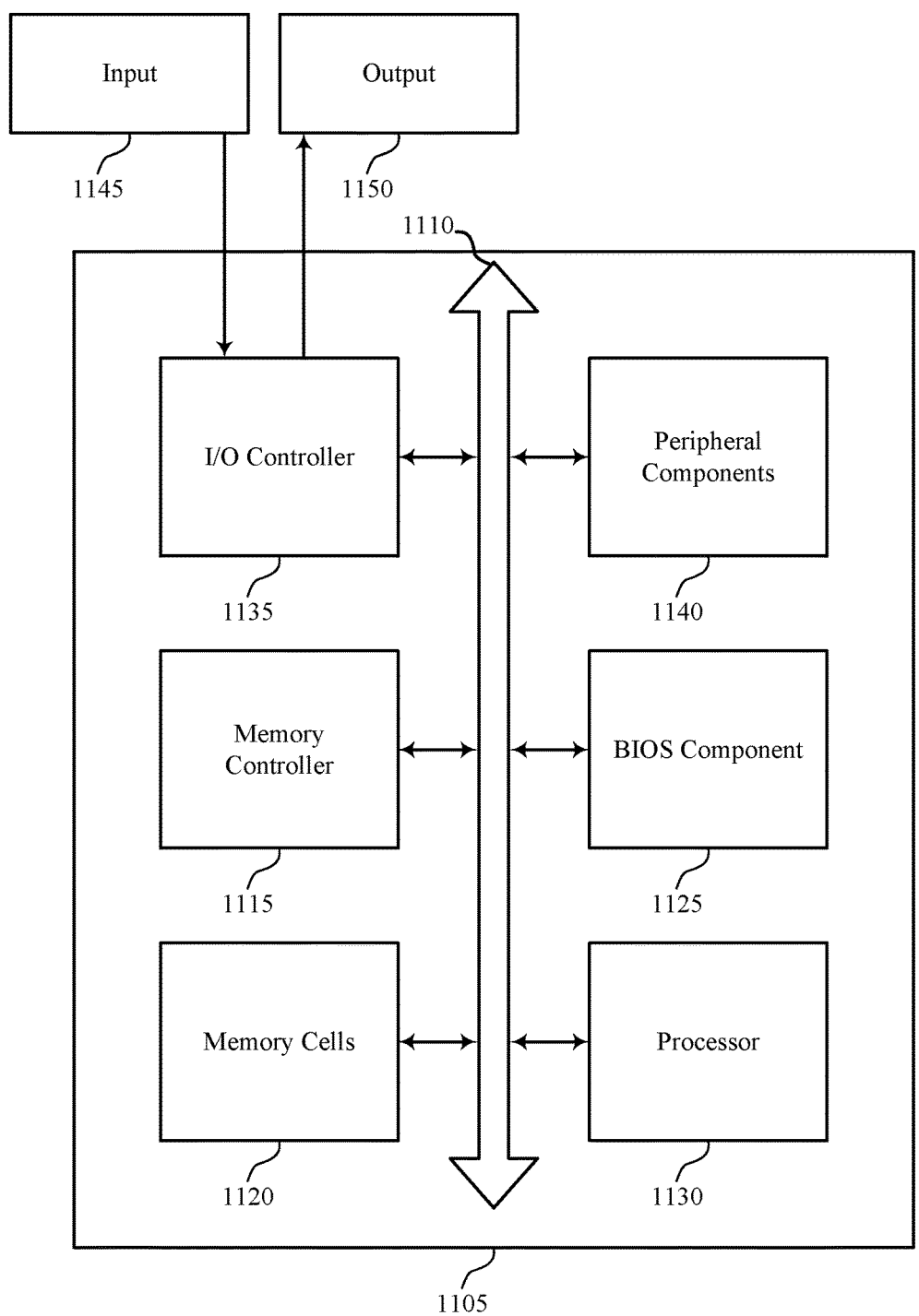
FIG. 11 illustrates a block diagram of a system including a memory die that supports compensating for memory input capacitance in accordance with examples of the present disclosure.

FIG. 11 shows a diagram of a system 1100 including a device 1105 that supports compensating for memory input capacitance in accordance with examples of the present disclosure. Device 1105 may be an example of or include the components of memory die 105 as described above, e.g., with reference to FIG. 1. Device 1105 may include components for bi-directional voice and data communications including components for transmitting and receiving communications, including memory controller 1115, memory cells 1120, basic input/output system (BIOS) component 1125, processor 1130, I/O controller 1135, and peripheral components 1140. These components may be in electronic communication via one or more buses (e.g., bus 1110).

Memory controller 1115 may operate one or more memory cells as described herein. Specifically, memory controller 1115 may be configured to support compensating for memory input capacitance. In some cases, memory controller 1115 may include a row decoder, column decoder, or both, as described herein (not shown).

Memory cells 1120 may store information (i.e., in the form of a logical state) as described herein.

BIOS component 1125 be a software component that includes BIOS operated as firmware, which may initialize and run various hardware components. BIOS component 1125 may also manage data flow between a processor and various other components, e.g., peripheral components, input/output control component, etc. BIOS component 1125 may include a program or software stored in read only memory (ROM), flash memory, or any other non-volatile memory.

Processor 1130 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1130 may be configured to operate a memory array using a memory controller. In other cases, a memory controller may be integrated into processor 1130. Processor 1130 may be configured to execute computer-readable instructions stored in a memory to perform various functions (e.g., functions or tasks supporting compensating for memory input capacitance).

I/O controller 1135 may manage input and output signals for device 1105. I/O controller 1135 may also manage peripherals not integrated into device 1105. In some cases, I/O controller 1135 may represent a physical connection or port to an external peripheral. In some cases, I/O controller 1135 may utilize an operating system such as iOS®, ANDROID®, MS-DOS®, MS-WINDOWS®, OS/2®, UNIX®, LINUX®, or another known operating system. In other cases, I/O controller 1135 may represent or interact with a modem, a keyboard, a mouse, a touchscreen, or a similar device. In some cases, I/O controller 1135 may be implemented as part of a processor. In some cases, a user may interact with device 1105 via I/O controller 1135 or via hardware components controlled by I/O controller 1135.

Peripheral components 1140 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 1145 may represent a device or signal external to device 1105 that provides input to device 1105 or its components. This may include a user interface or an interface with or between other devices. In some cases, input 1145 may be managed by I/O controller 1135, and may interact with device 1105 via a peripheral component 1140.

Output 1150 may also represent a device or signal external to device 1105 configured to receive output from device 1105 or any of its components. Examples of output 1150 may include a display, audio speakers, a printing device, another processor or printed circuit board, etc. In some cases, output 1150 may be a peripheral element that interfaces with device 1105 via peripheral component(s) 1140. In some cases, output 1150 may be managed by I/O controller 1135

The components of device 1105 may include circuitry designed to carry out their functions. This may include various circuit elements, for example, conductive lines, transistors, capacitors, inductors, resistors, amplifiers, or other active or inactive elements, configured to carry out the functions described herein. Device 1105 may be a computer, a server, a laptop computer, a notebook computer, a tablet computer, a mobile phone, a wearable electronic device, a personal electronic device, or the like. Or device 1105 may be a portion or aspect of such a device.

In other examples, the memory controller 1115 may support means for transmitting a signal modulated with a modulation scheme having at least three levels through an access line to a memory die, wherein the inductive region is configured to alter a capacitance of the access line based at least in part on the transmission of the signal. Additionally or alternatively, for example, the memory controller 1115 may support means for transmitting a signal modulated with a modulation scheme having multiple levels to a memory die, wherein the inductive region is configured to alter a capacitance of the access line in response to the transmission of the signal.

Figure 12:
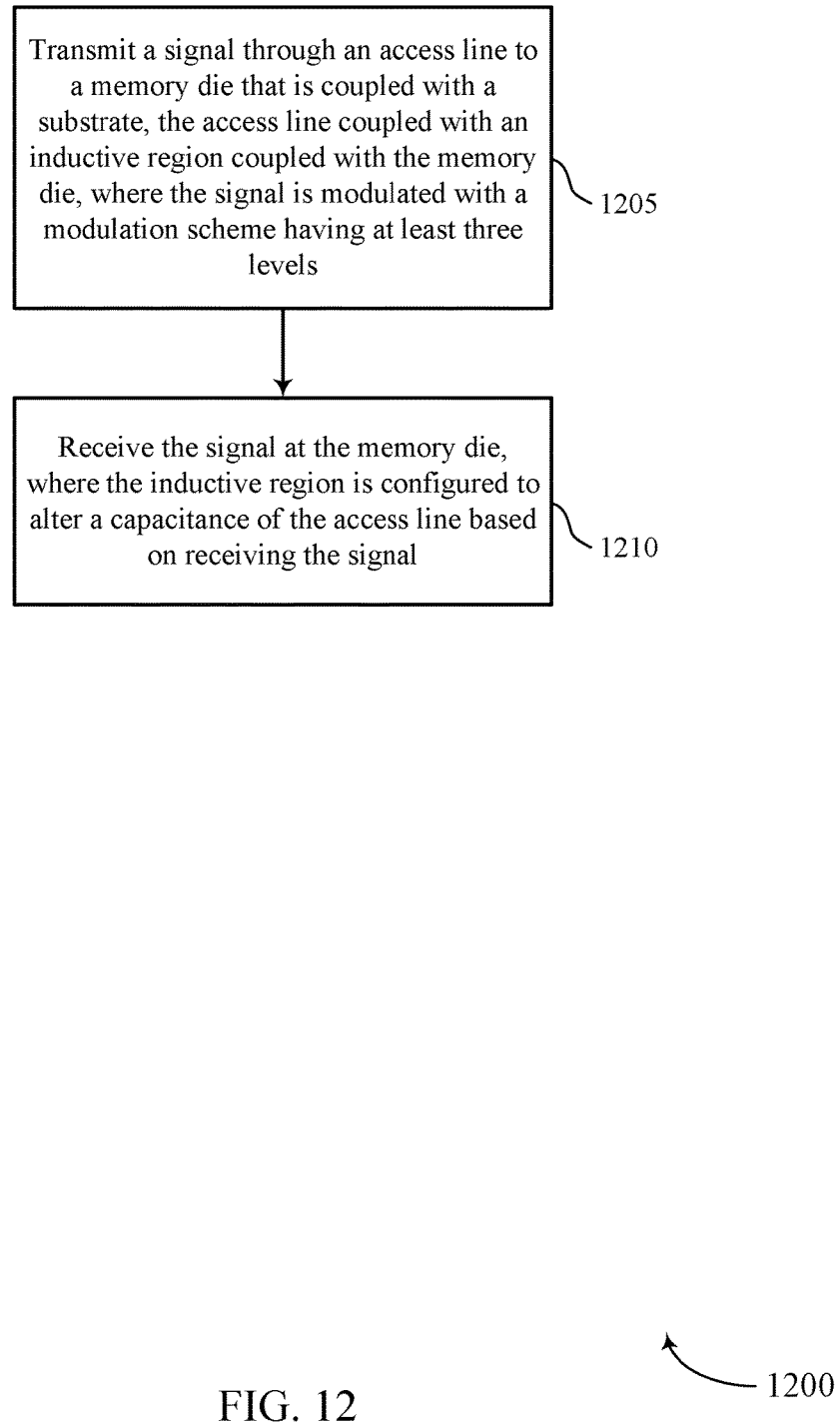
FIG. 12 illustrates a method for compensating for memory input capacitance in accordance with examples of the present disclosure.

FIG. 12 shows a flowchart illustrating a method 1200 for compensating for memory input capacitance in accordance with examples of the present disclosure. The operations of method 1200 may be implemented by a memory die (e.g., a memory die 105 as described with reference to FIG. 1) or its components as described herein. For example, the operations of method 1200 may be performed by a memory controller as described with reference to FIG. 10. In some examples, a memory controller may execute a set of codes to control the functional elements of the device to perform the functions described below. Additionally or alternatively, the memory controller may perform aspects of the functions described below using special-purpose hardware.

At 1205 the memory controller may transmit a signal through an access line to a memory die that is coupled with a substrate. In some examples, the access line may be coupled with an inductive region coupled with the memory die. In other examples, the signal may be modulated with a modulation scheme having at least three levels. The operations of 1205 may be performed according to the methods described herein. In certain examples, aspects of the operations of 1205 may be performed by a transmission component as described with reference to FIG. 10.

At 1210 the memory controller may receive the signal at the memory die. In some examples, the inductive region may be configured to alter a capacitance of the access line based at least in part on receiving the signal. The operations of 1210 may be performed according to the methods described herein. In certain examples, aspects of the operations of 1210 may be performed by a reception component as described with reference to FIG. 10.

In some cases, the method may also include transmitting a signal through an access line to a memory die that is coupled with a substrate. In some examples, the access line may be coupled with an inductive region coupled with the memory die. In other examples, the signal may be modulated with a modulation scheme having at least three levels. In some cases, the method may also include receiving the signal at the memory die. The inductive region may be configured to alter a capacitance of the access line based at least in part on receiving the signal. In other cases, the inductive region may be configured to alter the capacitance of the access line based at least in part on receiving a reflection of at least part of the signal from a second memory die coupled with the substrate.

It should be noted that the methods described above describe possible implementations, and that the operations and the steps may be rearranged or otherwise modified and that other implementations are possible. Further, examples from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "layer" used herein refers to a stratum or sheet of a geometrical structure. each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough so as to achieve the advantages of the characteristic.

The devices discussed herein, including memory subsystem 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a memory die coupled with an inductive region;
an access line coupled with the inductive region; and
a memory controller coupled with the access line, the memory controller operable to transmit a signal modulated with a modulation scheme having at least three levels through the access line to the memory die, wherein the inductive region is configured to alter a capacitance of the access line based at least in part on the transmission of the signal.

2. The apparatus of claim 1, further comprising:
a bond pad coupled with the access line and a substrate; and
a die pad coupled with the memory die, wherein the inductive region of the access line is coupled with the bond pad and the die pad of the memory die.

3. The apparatus of claim 1, wherein the inductive region and is configured in a shape of a coil.

4. The apparatus of claim 1, wherein the access line comprises a redistribution layer (RDL) coupled with a die pad of the memory die, and wherein the inductive region is embedded within a substrate.

5. The apparatus of claim 1, wherein the access line comprises a redistribution layer (RDL), and wherein the inductive region is positioned above a substrate and is coupled with a die pad of the memory die.

6. The apparatus of claim 1, wherein the access line, or the inductive region, or both are embedded within a substrate.

7. The apparatus of claim 1, wherein the inductive region is positioned above a die pad coupled with the memory die.

8. The apparatus of claim 1, further comprising:
a second memory die in a second layer coupled with a substrate, the second memory die configured to receive a second signal; and
a second access line coupled with a second inductive region coupled with the second memory die, wherein the second inductive region is configured to compensate for capacitance of the second access line based at least in part on the transmission of the signal to the memory die.

9. The apparatus of claim 1, further comprising:
a ball grid array (BGA) pad coupled with a substrate, wherein the memory die is embedded in an epoxy mold compound (EMC), wherein the access line comprises a redistribution layer (RDL), and wherein the access line is coupled with the BGA pad.

10. An apparatus, comprising:
an access line coupled with an inductive region;
the inductive region coupled with a memory die;
the memory die coupled with a substrate; and
a memory controller coupled with the access line, the memory controller operable to transmit a signal modulated with a modulation scheme having multiple levels to the memory die, wherein the inductive region is configured to alter a capacitance of the access line in response to the transmission of the signal.

11. The apparatus of claim 10, further comprising:
a second access line coupled with a second inductive region coupled with a second memory die, wherein the second inductive region is configured to alter the capacitance of the second access line based at least in part on a reflection of at least a part of the signal.

12. The apparatus of claim 11, wherein the access line comprises the inductive region and the second access line comprises the second inductive region.

13. The apparatus of claim 11, wherein the memory die and the second memory die are different memory dies in a same package.

14. The apparatus of claim 11, wherein each of the access line and the second access line comprise a redistribution layer (RDL).

15. The apparatus of claim 10, wherein the inductive region comprises a first inductive segment extending in a first direction, and a second inductive segment extending in a second direction different from the first direction.

16. The apparatus of claim 10, wherein the inductive region is positioned above the substrate coupled with the memory die and is coupled with a die pad of the memory die.

17. The apparatus of claim 10, wherein the access line is coupled with a pad of the memory die, and wherein the inductive region is embedded within the substrate coupled with the memory die.

18. The apparatus of claim 10, wherein the access line is coupled with a pad of the memory die, and wherein the inductive region is in contact with the substrate coupled with the memory die.

19. A method, comprising:
transmitting a signal through an access line to a memory die that is coupled with a substrate, the access line coupled with an inductive region coupled with the memory die, wherein the signal is modulated with a modulation scheme having at least three levels; and
receiving the signal at the memory die, wherein the inductive region is configured to alter a capacitance of the access line based at least in part on receiving the signal.

20. The method of claim 19, wherein the inductive region is configured to alter the capacitance of the access line based at least in part on receiving a reflection of at least part of the signal from a second memory die coupled with the substrate.

* * * * *